United States Patent
Dormans et al.

(10) Patent No.: US 7,006,381 B2
(45) Date of Patent: Feb. 28, 2006

(54) SEMICONDUCTOR DEVICE HAVING A BYTE-ERASABLE EEPROM MEMORY

(75) Inventors: Guido Jozef Maria Dormans, Nijmegen (NL); Robertus Dominicus Joseph Verhaar, Nijmegen (NL); Joachim Christoph Hans Garbe, Schenefeld (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 21 days.

(21) Appl. No.: 10/497,262

(22) PCT Filed: Oct. 24, 2002

(86) PCT No.: PCT/IB02/04473

§ 371 (c)(1),
(2), (4) Date: May 27, 2004

(87) PCT Pub. No.: WO03/047163

PCT Pub. Date: Jun. 5, 2003

(65) Prior Publication Data

US 2005/0052918 A1    Mar. 10, 2005

(30) Foreign Application Priority Data

Nov. 27, 2001    (EP) ................... 01204570

(51) Int. Cl.
*G11C 11/34* (2006.01)

(52) U.S. Cl. .................... 365/185.28; 365/230.03
(58) Field of Classification Search ........... 365/185.01, 365/185.33, 185.28, 230.03

See application file for complete search history.

(56) References Cited

U.S. PATENT DOCUMENTS

| | | | |
|---|---|---|---|
| 5,406,521 A | * | 4/1995 | Hara ............... 365/185.25 |
| 5,455,790 A | | 10/1995 | Hart et al. |
| 6,038,170 A | * | 3/2000 | Shiba ............... 365/185.13 |
| 6,475,846 B1 | * | 11/2002 | Marotta et al. ....... 438/201 |

FOREIGN PATENT DOCUMENTS

| JP | 2000 021183 | 1/2000 |
|---|---|---|
| WO | WO 00 75994 | 12/2000 |

OTHER PUBLICATIONS

Patent Abstracts of Japan vol. 2000, No. 04, Aug. 31, 2000 & JP 2000 021183, Jan. 21, 2000, Abstract; Figures 1, 3-6.

* cited by examiner

*Primary Examiner*—Michael Tran
(74) *Attorney, Agent, or Firm*—Peter Zawilski (57) ABSTRACT

The invention relates to a semiconductor device having a byte-erasable EEPROM memory comprising a matrix of rows and columns of memory cells. In order to provide a semiconductor device having a byte-erasable EEPROM which has a reduced chip size and increased density and which is suitable for low-power applications it is proposed according to the present invention that the memory cells each comprise a selection transistor having a selection gate and, arranged in series therewith, a memory transistor having a floating gate and a control gate, the selection transistor being further connected to a source line of the byte-erasable EEPROM memory, which source line is common for a plurality of memory cells, and the memory transistor being further connected to a bit line of the byte-erasable EEPROM memory, wherein the columns of memory cells are located in separate p-type wells separated by n-type wells. Preferably, high voltage switching elements are provided for dividing global control gates into local control gates for each column of bytes.

9 Claims, 6 Drawing Sheets

SEMICONDUCTOR DEVICE HAVING A BYTE-ERASABLE EEPROM MEMORY

The invention relates to a semiconductor device having a byte-erasable EEPROM memory comprising a matrix of rows and columns of memory cells.

There are two main types of electrically erasable non-volatile memories. Byte-erasable EEPROM memories are used for persistent data storage. To this purpose the memory can be programmed and erased per byte. Program and erase times are fast and reliability requirements are high. This is achieved by designing a robust cell that is insensitive to disturbs. As a consequence the cell size is relatively large.

The most commonly used non-volatile memory nowadays is known as Flash. Flash EEPROMs are used to store persistent code and are typically programmed per byte but erased per block or per sector. Because of the sector or block erase, the disturb conditions are relatively relaxed. Also the reliability requirements (in terms of the number of program/erase actions) are relaxed. This allows making much smaller cells than byte-erasable EEPROM cells.

Most commonly used byte-erasable EEPROM cells are based on the FLOTOX principle. FLOTOX cells consist of a double gate structure with a floating gate and a control gate separated by a dielectric layer. The floating gate is located on a relatively thick gate oxide (20–40 nm) in which a tunnel window is made with a thinner oxide layer (typically 7–10 nm). Below the tunnel oxide is a highly n-type doped injector region. Applying a large positive voltage (10–15 V) to the injector region with the control gate grounded performs programming. Electrons are ejected from the floating gate to the injector region by Fowler-Nordheim (FN) tunneling. Applying a large positive voltage to the control gate and grounding the injector region erases cells. Electrons are injected into the floating gate by FN tunneling.

The use of FN tunneling for write and erase is very efficient and consumes very little power. This makes a FLOTOX type of byte-erasable EEPROMs very suitable for portable applications and (contact-less) smart cards. The disadvantage of FN tunneling is that relatively high voltages are required.

The reliability of FLOTOX type of EEPROMs is achieved by separating the tunnel window both on the source side as well as the drain side of the cell by a high-voltage transistor. The high-voltage transistor on the source side is also used as a read transistor. A high-voltage transistor on the drain side is used to isolate the injector region from high bit line potential for non-selected cells.

In IC manufacturing there is also a strong desire to reduce the size of non-volatile cells. Because of the reliability restrictions for these memories the tunnel oxide thickness cannot be decreased below 7 to 8 nm. As a consequence, voltages needed to program and erase more or less remain constant from generation to generation. It becomes more and more difficult to support these voltages when all other dimensions on the chip become smaller. Particularly the FLOTOX type of byte-erasable EEPROM is very hard to scale as the device consists of two high-voltage transistors in series with an injector region. Moreover, in the operation of this device high voltages are used on the bit lines (drains) of the cells. This also puts a restriction on the cell dimension because high-voltage parasites have to be suppressed in the memory array.

Another trend in modem IC processes is to combine the two types of non-volatile devices, i.e. flash-EEPROM and byte-erasable EEPROM, on one chip. Generally, however, flash and EEPROM are made in different processes. Combination of these processes is not trivial and will lead to an increase of process complexity and cost.

One way to diminish the cell size of byte-erasable EEPROMs and to combine them with flash EEPROMs is to try to make a byte-erasable EEPROM starting from a flash-EEPROM cell. The usual flash EEPROM is of the ETOX type. It consists of a single floating-gate cell. Programming is achieved by channel hot electron injection at the drain side of the cell by applying a moderate voltage (4–6 V) to the drain and a high voltage to the control gate (8–12 V). Erasing is achieved by either applying a large positive voltage to the source (10–15 V) and grounding the control gate or by applying a moderate voltage to the source (4–6V) with a negative voltage (−6 to −10 V) on the control gate. Erasing is done by FN tunneling. The programming is very fast (10–100 microseconds) but very power consuming (i.e. with a very high drain current (0.1–0.5 mA) per cell). Erasing is very slow (seconds) but at very low currents (nano-Amperes per cell).

However, ETOX cells are not very attractive for byte-erasable EEPROM applications for the following reasons:
  very power consuming during program
  drain junction is optimized for channel hot electron injection. This makes these cells very sensitive to drain disturbs during programming of other cells in the array.
  erased threshold voltages have to be distinctly above about 1 V to avoid cells from over-erasure into a depletion state. This would lead to device failure. Therefore, cells should be read with a control gate voltage well above this 1 V (typically >2.5 V). FLOTOX cells can be erased to a negative threshold, as the cells are isolated from the array by a drain side select gate. Therefore, these cells can be read at very low control gate voltages.

WO 00/75994 A1 describes an alternative 2-transistor flash cell that is optimized for low-voltage and low-power embedded flash applications. One cell consists of a stacked gate transistor with a floating gate and a control gate on top and an isolation transistor at the source side. The cell can be programmed and erased by FN tunneling from the floating gate to the channel of the stacked gate transistor. The drain and source junctions can be very soft to suppress disturbs and to optimize for short channel effects. This allows making a relative short stacked gate and isolation transistor. Because of the presence of the isolation transistor the cell can be erased to a negative threshold voltage. Reading can thus be done at low voltages, similar to a FLOTOX EEPROM. A 2-transistor flash cell is thus ideally suited to use for byte-erasable EEPROMs.

A byte-erasable EEPROM having a matrix of memory cells each comprising a select transistor and a floating gate transistor is known from GB 2 321 738 A. The memory cells are coupled to bit lines and common control lines. Programming transistors are coupled between an erase line and a common control line of one row of memory cells.

It is an object of the present invention to provide a semiconductor device having a byte-erasable EEPROM which has a reduced chip size and increased density and which is suitable for low-power applications.

This object is achieved according to the invention by a semiconductor device as claimed in claim 1, wherein the memory cells each comprise a selection transistor having a selection gate and, arranged in series therewith, a memory transistor having a floating gate and a control gate, the selection transistor being further connected to a source line of the byte-erasable EEPROM memory, which source line is common for a plurality of memory cells, and the memory transistor being further connected to a bit line of the byte-erasable EEPROM memory, wherein the columns of memory cells are located in separate p-type wells separated by n-type wells.

The invention is based on the idea to use a 2-transistor flash cell also for byte-erasable EEPROM applications. Because of this, combinations of flash and byte-erasable EEPROM can be made on one chip without process adaptations. Both flash and EEPROM are processed on a triple well structure; i.e. the non-volatile cells are processed in an isolated p-type Well (i-pWell) that is isolated from the environment by a buried n-type Well. This allows the use of negative voltages during program and erase. To suppress disturbs the memory array is divided in byte columns located each in an i-pWell and separated by nWells. The semiconductor device according to the invention thus has a very high density and a very high performance.

In contrast to standard FLOTOX memory cells where the bit line is contacted at the side of the access transistor, the bit line is connected to the memory transistor according to the present invention. This leads to a different write operation as will be explained below. Further, since the second transistor does not have to be switch through a high voltage, it can be processed on the tunnel oxide rather than on a special high voltage oxide, which would make the memory cell very much larger. Still further, the byte-erasable EEPROM according to the invention is suitable for combination with a flash EEPROM on the same chip.

Preferred embodiments of the invention are included in the dependent claims. To make the memory cells erasable per byte (or word) without getting major gate disturbs in non-selected words the global control gate lines are divided in local control gate lines that run over one byte. Switching elements achieve control gate separation. As the switching elements have to switch through a high voltage they must be high voltage (HV) devices. HV transistors can be very large, depending on the voltages they have to handle: the larger the voltage the larger the size. Therefore, it is preferred to keep these voltages as low as possible.

In the known byte-erasable EEPROM memories of the FLOTOX type a HV nMOS switching element is used. According to the present invention the switching elements can be HV-nMOS or HV-pMOS or even HV-CMOS switching elements. Either of these elements can be used having advantages and disadvantages. An evaluation of all possibilities shows that a HV-pMOS switch is preferably used because:

It takes the least space, as the HV-pMOS elements can be located in the high voltage n-type well areas that are already used to separate the i-pWells per column.

pMOS elements have a lower threshold voltage at back-bias than nMOS elements. Hence, the gate voltage to switch through a control gate potential can be lower for a pMOS than for a nMOS element.

During a read operation a positive control gate voltage (i.e. 1V) has to be switched through the selection devices. In case of a HV-nMOS transistor a higher voltage on the gate of the transistor is needed (i.e. >2V) to switch the control gate voltage through. This value is above the supply voltage of modern IC processes (1.8V and below). This would imply that the gates of the byte selection devices have to be pumped during read giving a lot of power consumption. For a pMOS transistor the gate can be grounded to switch through a positive gate voltage.

Addressing of said switching elements, i.e. addressing of single bytes, is preferably done using byte select gate lines to which said switching elements are connected.

According to the preferred embodiment of claim 5 sectors are defined by dividing global bit lines into to local bit lines for each sector and by using sector select gate lines for addressing of said sectors. Thus, program disturbs in non-selected sectors can be avoided and bit line capacitance can be reduced during read making the memory much faster.

The semiconductor device according to the invention is suitable for combining the byte-erasable EEPROM with a flash EEPROM on one chip as defined in claim 6.

Preferably, said p-type wells are isolated by buried n-type wells. Preferred ways of applying a write, read and erase operation to the semiconductor device according to the invention are defined in claims 8 to 10.

The invention will now be explained in more detail with reference to the drawings, in which.

Figure 1:
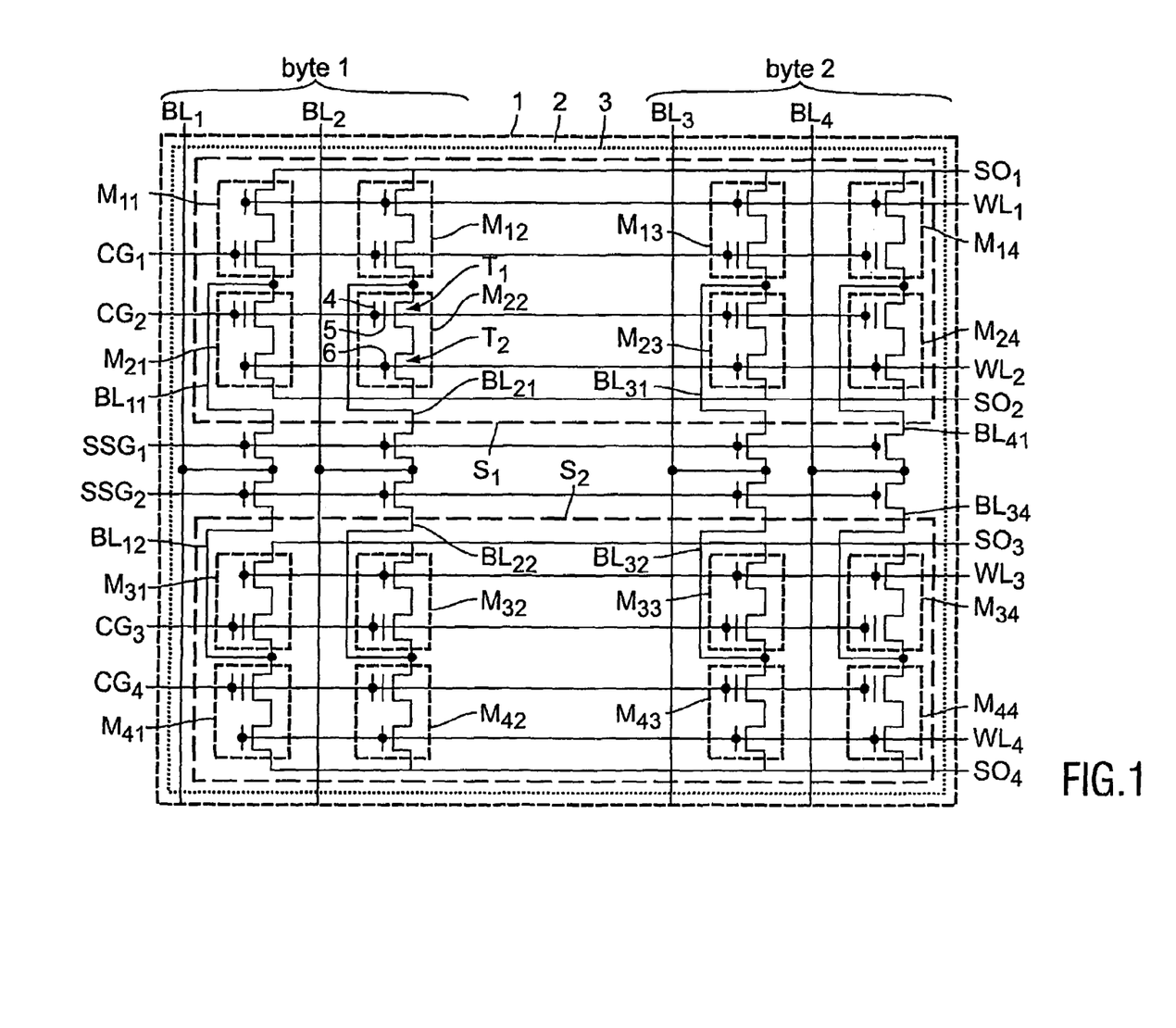
FIG. 1 shows an electric circuit diagram of a known flash EEPROM.

FIG. 1 shows an electric circuit diagram of relevant parts of a known semiconductor device comprising a flash EEPROM using 2-transistor flash cells. Therein it is schematically illustrated how such a memory array is organized by showing schematically two bytes each being segmented into two sectors. Per byte only two bits are shown. The EEPROM memory 1 comprises a matrix of memory cells $M_{ij}$, e.g. $M_{11}, M_{12}, \ldots, M_{44}$, arranged in rows and columns, in which i is the number of the row and j is the number of the column. Each memory cell comprises a memory transistor T1 having a floating gate 5 and a control gate 4 and, in series therewith, a selection transistor T2 having a selection gate 6. The control gates 4 of a plurality of memory transistors T1 are interconnected per row by control gate lines $CG_i$, e.g. $CG_1$–$CG_4$, while the selection gate 6 of the selection transistors T2 are interconnected per row by word lines $WL_i$, e.g. $WL_1$–$WL_4$. A plurality of selection transistors T2 is interconnected by a common source line. These common source lines $SO_i$, e.g. $SO_1$–$SO_4$, can be organized per row, per column, per sector or for the whole memory. It should be noted that in the present embodiments not all interconnections of source lines are shown.

The whole memory 1 is located in one large isolated p-type well 3 (i-pWell) with a buried n-type well 2 (BNW) beneath. The memory 1 is organized in sectors $S_m$, e.g. $S_1$–$S_2$, by dividing the global bit lines $BL_j$, e.g. $BL_1$–$BL_4$, into local bit lines $BL_{jm}$, e.g. $BL_{11}$–$BL_{42}$, that are addressed by a sector select gate line $SSG_m$. As the $SSG_m$ only has to switch through a relatively low voltage (typically 5V) no high voltage (HV) transistor is needed. Therefore, it can be a nMOS device processed on the same oxide as the memory cells $M_{ij}$. The function of the sector segmentation is to suppress program disturbs in non-selected sectors and to reduce the capacitive load of the bit lines during read. The latter makes the memory much faster.

Figure 2:
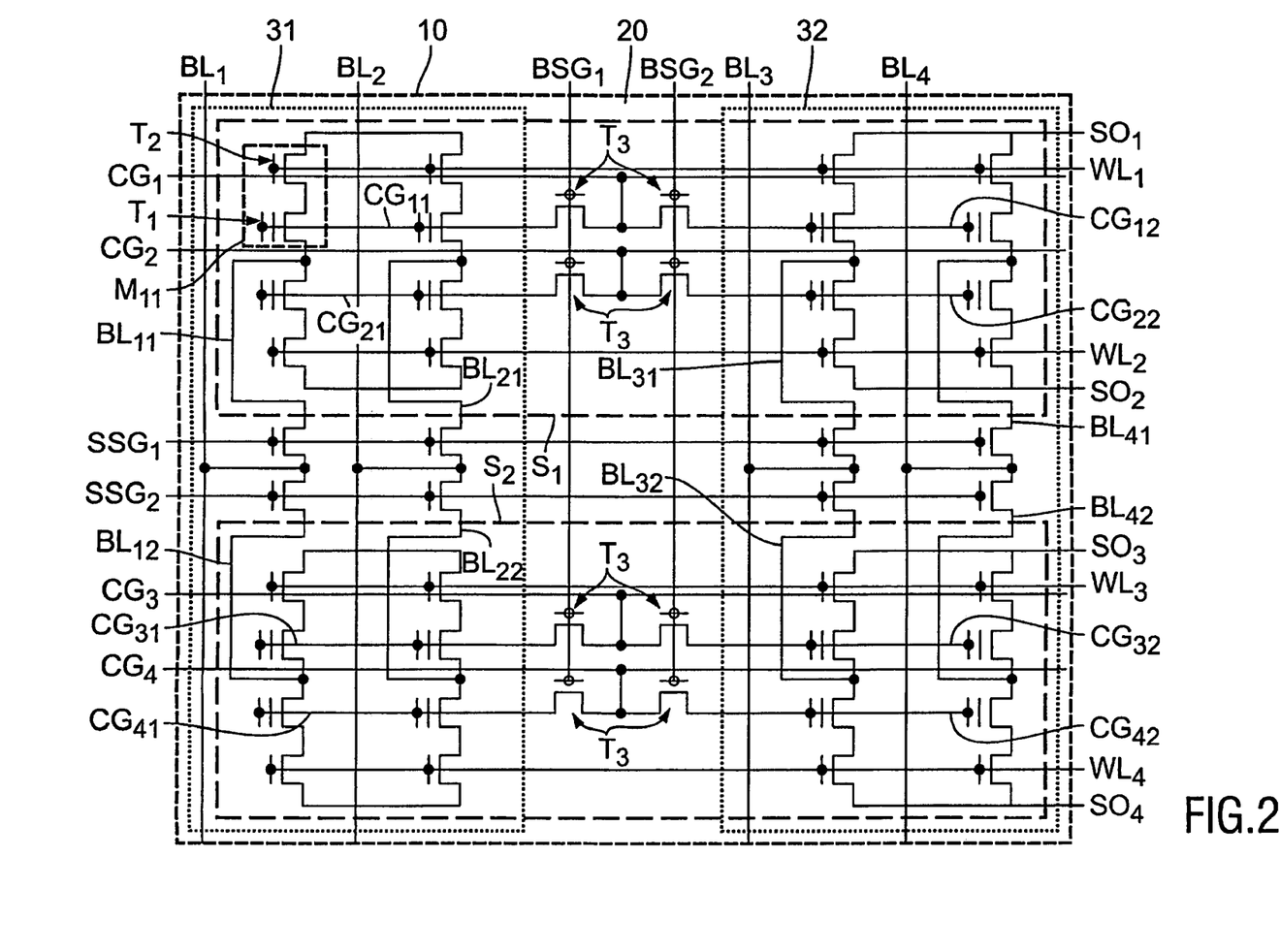
FIG. 2 shows an electric circuit diagram of a byte-erasable EEPROM as used in a semiconductor device according to the invention.

FIG. 2 shows an electric circuit diagram of relevant parts of a semiconductor device according to the invention comprising a byte-erasable EEPROM using 2-transistor flash cells. Therein it is schematically illustrated how the byte-erasable EEPROM memory 10 matrix is organized. The general arrangement of the memory cells $M_{ij}$ in a matrix, the memory cells $M_{ij}$ itself and the transistors T1, T2 used therein are identical to the electric circuit shown in FIG. 1.

Compared to the matrix of the flash EEPROM shown in FIG. 1 the byte columns are now located in separate i-pWells 31, 32 separated by a n-type well 20, preferably a high-voltage nWell (HNW). Therein HV-pMOS transistors T3 are used as switching elements to divide the global control gate lines $CG_i$ into local control gate lines $CG_{in}$, e.g. $CG_{11}-CG_{42}$, that run over one byte (or word).

Byte selection gate lines $BSG_n$, e.g. $BSG_1-BSG_2$, that run parallel to the bit lines $BL_j$ addresses the HV-pMOS devices T3. Although not strictly necessary, sectors $S_m$, e.g. $S_1-S_2$, are defined by using sector select gate lines $SSG_m$, e.g. $SSG_1-SSG_2$, as for the flash memory to reduce bit line capacitance during read.

To write, read and erase only data in the memory cells $M_{ij}$ of the EEPROMs shown in FIGS. 1 and 2, the voltages as given in the following tables are applied to the above mentioned lines.

Table 1 gives an example for an operation table for the flash memory as shown in FIG. 1.

|  | BL | WL | CG | SSG | SO | BSG | i-pWell | BNW |
|---|---|---|---|---|---|---|---|---|
| Write |  |  |  |  |  |  |  |  |
| selected | −5/0 V | −5 V | 10 V | 1 V | Float | — | −5 V | 0 V |
| un-selected | 0 V | −5 V | 0 V | −5 V |  | — |  |  |
| Erase |  |  |  |  |  |  |  |  |
| selected | float |  | 5 V | −10 V | 5 V | Float | — | 5 V | 5 V |
| un-selected | float |  | 5 V | −10 V | 5 V |  | — |  |  |
| Read |  |  |  |  |  |  |  |  |
| selected | 0.5 V | Vdd | 1 V | Vdd | 0 V | — | 0 V | Vdd |
| un-selected | 0 V | 0 V | 1 V | 0 V |  | — |  |  |

Table 2 gives an example for the byte-erasable EEPROM memory as shown in FIG. 2.

|  | BL | WL | CG | SSG | SO | BSG | i-pWell | BNW |
|---|---|---|---|---|---|---|---|---|
| Write |  |  |  |  |  |  |  |  |
| selected | −5/0 V | −5 V | 10 V | 1 V | float | 0 V | −5 V | 10 V |
| un-selected | 0 V | −5 V | 0 V | −5 V |  | 10 V | 0 V |  |
| Erase |  |  |  |  |  |  |  |  |
| selected | float | float | −5 V | float | float | −8 V | 10 V | 10 V |
| un-selected | float | float | 6 V | float | | 6 V | 6 V |  |
| Read |  |  |  |  |  |  |  |  |
| selected | 0.5 V | Vdd | 1 V | Vdd | 0 V | 0 V | 0 V | Vdd |
| un-selected | 0 V | 0 V | 0 V | 0 V |  | 1 V | 0 V |  |

A comparison of the two tables shows that the operation schemes for the two memories are very similar. This particular combination of flash and byte-erasable EEPROM is therefore not only attractive because they can be combined in one technology but also from an operation and application point of view.

Figure 3:
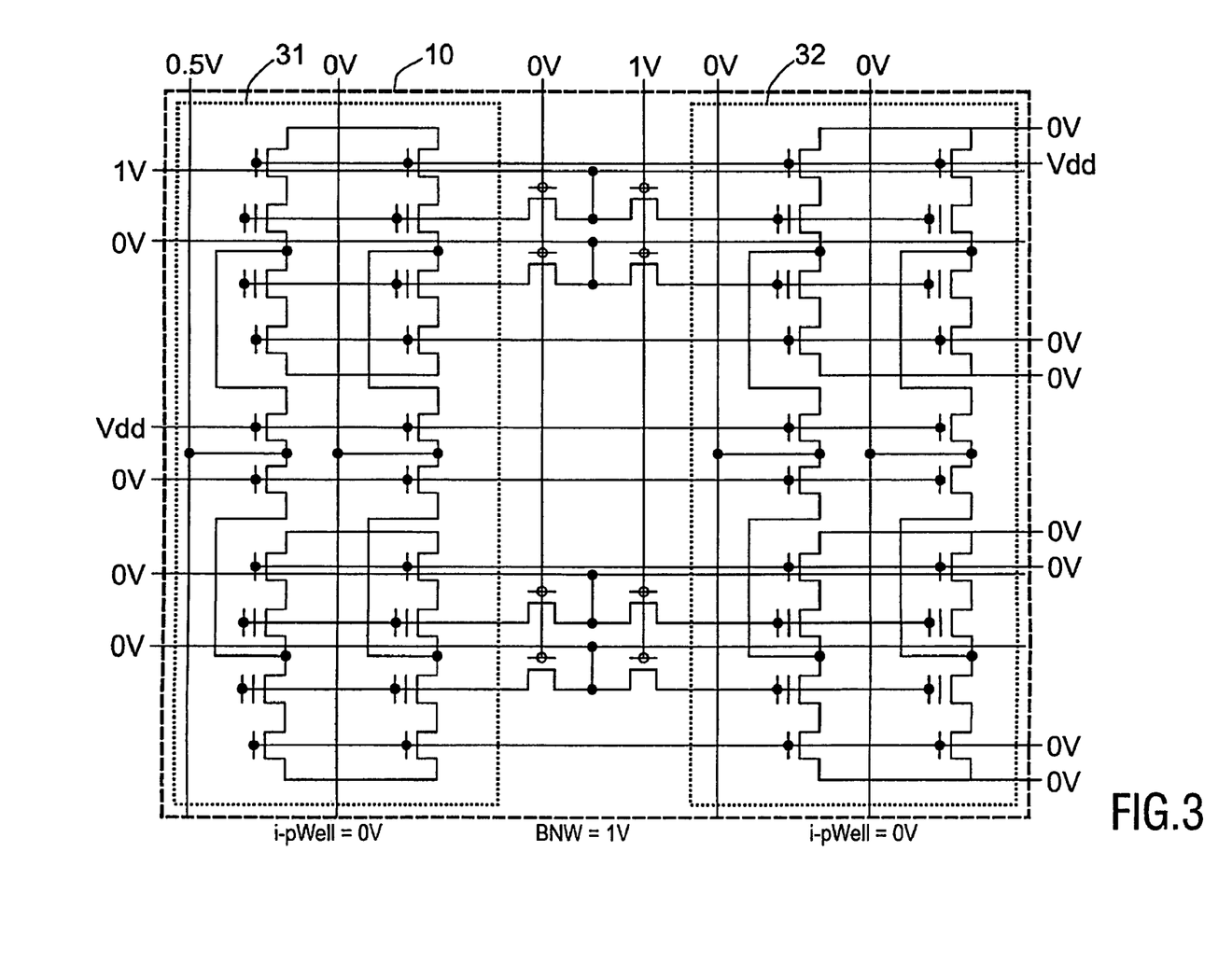
FIG. 3 shows the byte-erasable EEPROM of FIG. 2 during a read operation.

The operation scheme of the byte-erasable EEPROM according to the invention is now further described with reference to FIGS. 3–5. FIG. 3 shows how the voltages are applied to the various lines. The read operation is very close to reading the corresponding flash memory. The state of a cell is detected by applying a low voltage of 0.5V to the drain and 1V to the CG while the select gate on the WL is opened. Depending on whether the cell is programmed (threshold voltage >1V) or erased (threshold voltage <0V) a current flows from source to bit line. The BSG switches through the CG voltage by grounding its gate. Read disturb in this memory is very small because of the low voltages applied to the drain and gate of the stacked gate transistor. Closing the BSG of non-selected columns and the SSG of non-selected sectors further reduces this disturb.

Figure 4:
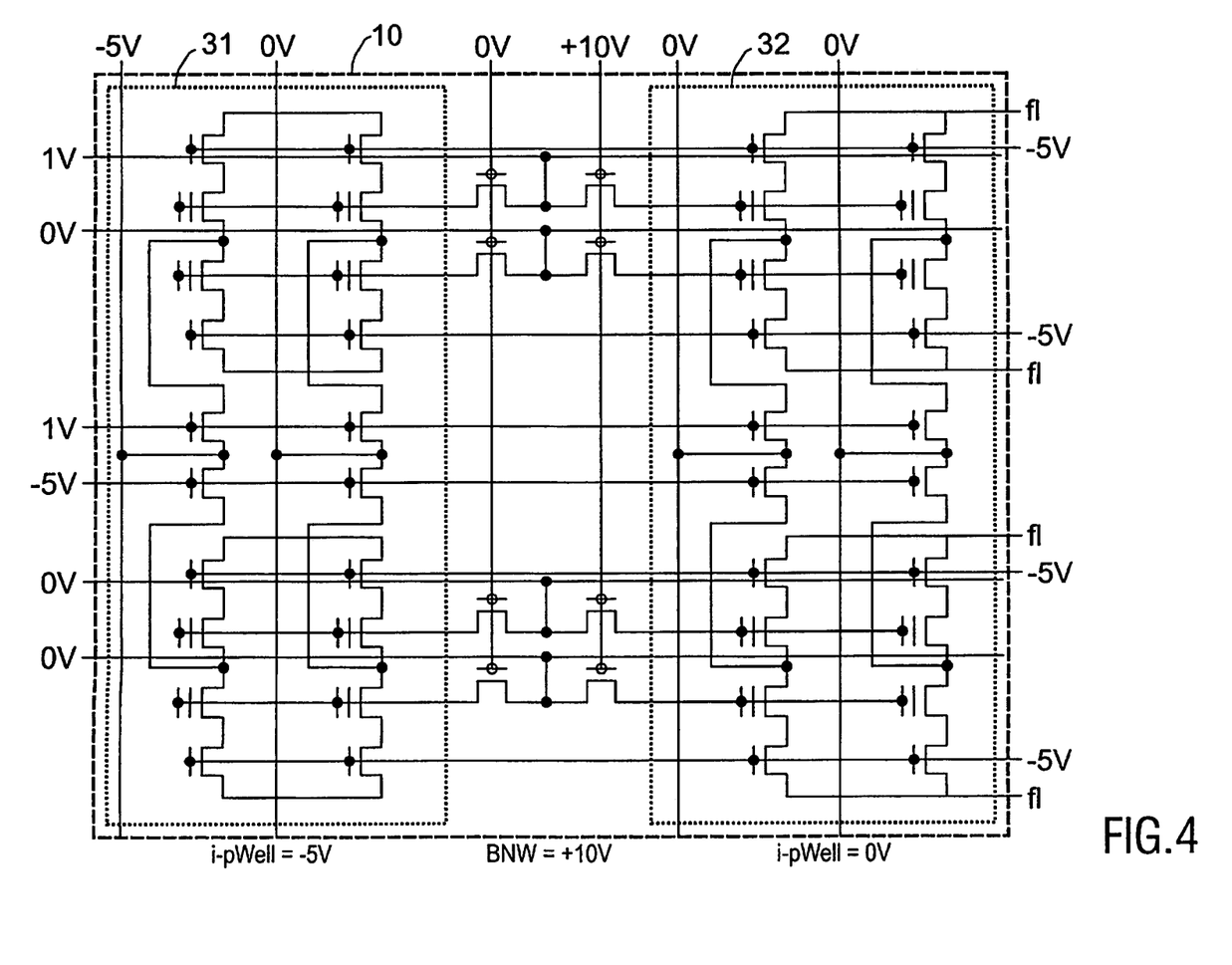
FIG. 4 shows the byte-erasable EEPROM of FIG. 2 during a write operation.

The write operation is schematically shown in FIG. 4. A cell is programmed in an identical way as a flash cell. A positive voltage (+10V) is applied to the CG of a selected cell with the i-pWell biased negatively (−5V). The bit lines in a selected byte column are biased either to −5V ("write 0") or grounded ("write 1"). Under these conditions the channel of selected cells is inverted. Hence, the channel potential equals the drain potential. In case of "write 0" a voltage difference of 15V between CG and channel causes electron tunneling to the floating gate of the cell thus increasing the threshold voltage of the cell. For a "write 1" the voltage difference is 5V less which is sufficient to suppress electron tunneling during one or more programming pulses ("program inhibit"). Typical program times are in the order of milliseconds.

The CG voltage of 10V is switched through the BSG by grounding the gate of this transistor. Program disturbs on cells of non-selected bytes (i.e. on the same row as the selected byte) are avoided by grounding the i-pWell of those bytes and by closing the BSG. This is achieved by putting the same voltage to the gate of this transistor as to the BNW; i.e. 10V in this example. By doing so, BSGs in non-selected columns are off and the local CGs in these bytes are floating (indicated by "fl"). Their potential will be capacitively coupled to their environment. The main contribution will come from the i-pWell potential. Therefore, the local CG potential will be close to the i-pWell potential and there will be only a very small disturbance. The local CG potential can further increase by junction leakage from the HNW and by sub-threshold leakage through the channel of the BSG. To avoid this, the BSG should be sufficiently long and the junction should have a high breakdown value. For the same reason, the positive programming voltage (10V) should be kept as low as possible. However, making this value too low will cause disturbs in selected columns, as will become clear.

It is also important that between multiple program actions the local CGs are reset to zero to avoid cumulative program disturbs.

In a selected column the local CGs of non-selected rows are closed by applying zero volt to the global CGs. Depending on the local CG potential, these BSGs can be open (positive potential) or off (negative potential). If for some reason, i.e. capacitive coupling or junction leakage from the HNW, the local CG potential becomes positive the potential will never increase to a value above one threshold voltage (with backbias) of the BSG. Therefore, the transistor will be always off and the local CG will be capacitively coupled to a negative value by the i-pWell potential and the drain potentials of bit lines that are either at 0V or −5V. Depending on the state of the memory cells (0 or 1) and the data on the bit lines, the local CGs will charge to a voltage between typically −1V and −4V. For cells with −5V on the drain, this will give a very small gate disturbance. For cells with 0V on the drain this can cause a drain disturb. Particularly for cells that are in the programmed state (i.e. with negative charge on the floating gate) the drain is positively biased compared to the floating gate. This may cause electron loss from the floating gate to the drain or hole injection caused by electron-hole formation due to substrate currents generated by the gated reverse-biased drain junction (GIDL: gate induced drain leakage). Several measures are taken to suppress this drain disturb:

Reduce the inhibit voltage as much as possible. However, there is a minimum set by the program inhibit disturb (write "1").

Make the drain junction as soft as possible. This can be done in this particular 2-transistor cell because the drain junction is not used other than for link-up of the channel of the cell to the bit line contact. For many other flash cells this drain junction is optimized for either hot electron injection or electron tunneling from the gate to the drain. In both cases the junction is very hard giving rise to large substrate currents when the drain is reverse biased.

Reduce the number of rows in a sector. By dividing the memory in sectors using SSGs, the local bit lines can be made floating when the SSGs are closed. In that case, even with the bit line at the inhibit voltage, the local bit line will follow the well potential thus avoiding drain disturbs.

Figure 5:
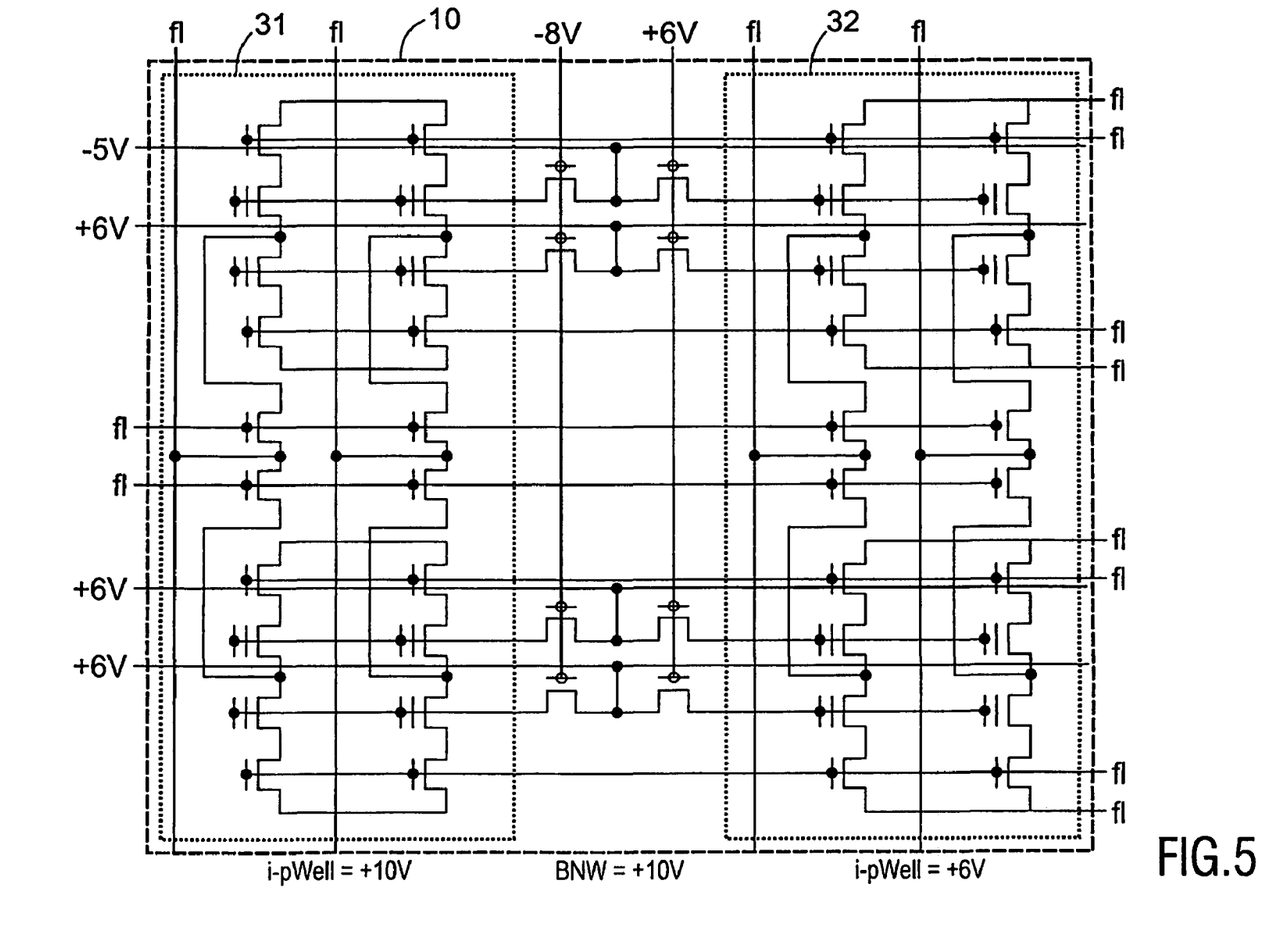
FIG. 5 shows the byte-erasable EEPROM of FIG. 2 during an erase operation.

The erase operation is shown schematically in FIG. 5. Cells are erased by applying a negative voltage to their CG (i.e. −5V) with the well positively biased (i.e. +10V). This causes electron ejection by FN-tunneling from the floating gate to the i-pWell thus reducing the threshold voltage to a negative value. For flash applications, typical erase times (per sector or per block) are in the order of 0.1–10 seconds. Therefore, the erase voltages can be kept relatively low. However, for byte-erasable EEPROM applications, the erase time must be in the order of milliseconds (similar to the program time). This can be achieved by increasing the erase voltages. However, this is not attractive from a point of view of disturbs and puts more stringent demands on the HV transistors that handle these voltages. This will cost chip area because larger transistors are needed and larger pumps to generate the higher voltages on-chip.

An alternative is to increase the CG to floating gate capacitive coupling in the cell so that the CG potential is more effectively coupled to the floating gate. This can be achieved by increasing the width of the floating gate thus increasing the area between floating gate and CG at the cost of a somewhat larger cell size. However, the cell layout will still be almost identical to that of the 2-transistor flash cell.

The negative CG voltage needed for erasing is switched through the BSG of a selected column by applying a sufficiently high negative voltage (i.e. −8V) to the gate of this HV-pMOS transistor.

Other potentials during an erase operation are carefully chosen to find an optimum between disturbs seen on non-selected pages in a selected column and bias conditions as experienced by the BSGs of non-selected columns. To avoid that the latter transistors have to handle the full erase voltage (i.e. 15V) that would make them very large, some disturbance in non-selected pages in a selected column is accepted.

An optimum is found by allowing a gate disturb of 4V on non-selected pages in a selected column and a voltage of −11V over the BSG transistors of a selected page in non-selected columns. The sum of these two voltages equals the total voltage swing (15V) needed for erasing. Of course, other voltage combinations can be chosen (i.e. 3V disturbance and −12V HV-pMOS stress) depending on how strong the HV-pMOS can be made.

Also the division of the total erasing voltage in a positive and a negative voltage can be optimized for optimal overall circuit performance. In the example of Table 2 and FIG. 5 the voltages during erase have been chosen such that they mimic those during program. This helps to keep the decoders relatively simple and reduces the number of different voltages to be generated and controlled by the peripheral circuit.

Control gates on non-selected pages in a selected row are biased to +6V so that the cells in those bytes experience a gate disturbance of −4V because the i-pWell of the selected column is biased to +10V. This can give rise to soft erasure of programmed cells. It can be shown that intrinsically cells will not significantly be erased even when this disturbance is applied during many erase cycles. To avoid that some (extrinsic) cells might fail, it can be considered to add error correction to the memory.

Disturbance in non-selected columns is suppressed by biasing the i-pWell to +6V and also the gates of the BSGs to +6V. The HNW, which is at +10V and the i-pWell, which is at +6V, will capacitively charge the local CGs in non-selected columns up to a value slightly above +6V. Global CGs are at either −5V (selected page) or +6V (non-selected page) so that the BSGs are off in all cases and the local CGs are floating. Because the largest capacitive coupling to the cells comes from the i-pWell, cells will charge to a value slightly above this well potential. Hence, the disturbance experienced by the cells is very small.

Figure 6:
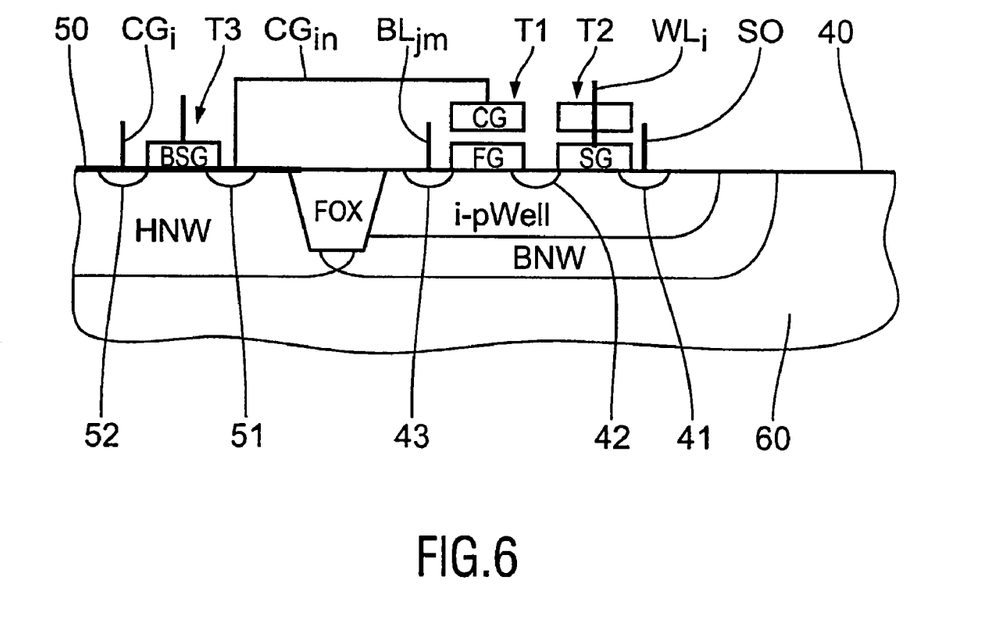
FIG. 6 shows a cross-sectional view of part of a byte-erasable EEPROM of FIG. 2.

FIG. 6 shows a cross section through a single memory cell and a portion of the n-type Well area. The silicon semiconductor body comprises a substrate 60 of the p-type. A deep buried n-type well BNW is provided in the substrate 60 and is provided with a less deep isolated p-type well i-pWell in which the memory transistor T1 and the selection transistor T2 are provided. The nWell BNW insulates the i-pWell from the p-type substrate 60, so that different voltages can be applied to the i-pWell compared with the voltages applied to the substrate 60. The selection transistor T2 comprises an n-type source 41, an n-type drain 42 and a select gate SG which is separated from the channel between the source and the drain by tunnel oxide 40. The gate SG is connected to a word line $WL_i$ and the source 41 is connected to a source line SO. The memory transistor T1 comprises a source formed by the zone 42 and an n-type drain 43 connected to a local bit line $BL_{jm}$. The floating gate FG is provided above the channel, insulated from the latter. The control gate CG is provided above the floating gate FG, electrically insulated therefrom, and is connected to a local control gate line $CG_{in}$.

Separated from the transistors T1 and T2 above the i-pWell area by a field oxide region FOX a n-type well, preferably a high voltage nWell HNW, is formed in the substrate 60 covered by high voltage oxide 50. A switching transistor T3 is formed by a source 51 connected to the local control gate line $CG_{in}$ and a drain 52 connected to the global control gate line $CG_i$. Electrically insulated therefrom a byte selection gate BSG connected to a byte selection gate line is formed on top of the oxide 50.

The invention claimed is:

1. A semiconductor device having a byte-erasable EEPROM memory comprising a matrix of rows and columns of memory cells which each comprises a selection transistor having a selection gate and, arranged in series therewith, a memory transistor having a floating gate and a control gate, the selection transistor being further connected to a source line of the byte-erasable EEPROM memory, which source line is common for a plurality of memory cells, and the memory transistor being further connected to a bit line of the byte-erasable EEPROM memory, wherein the columns of memory cells are located in separate p-type wells separated by n-type wells; and wherein high voltage switching elements are provided in said n-type wells for dividing global control gate lines into local control gate lines for each column of memory cells, said local control gate lines being connected to the control gates of said memory transistors.

2. The semiconductor device of claim 1, wherein said high voltage switching elements each comprises a nMOS transistor, a CMOS switch or, a pMOS transistor.

3. The semiconductor device of claim 1, wherein said switching element are connected to byte select gate lines provided for addressing said columns of memory cells.

4. The semiconductor device of claim 1, wherein said columns of memory cells are further divided into sectors by dividing global bit lines into local bit lines, each being connected to said memory transistors of a sector and being addressed by sector selection gate lines.

5. The semiconductor device of claim 1, further comprising a flash EEPROM memory comprising a matrix of rows and columns of memory cells which each comprises a selection transistor having a selection gate and, arranged in series therewith, a memory transistor having a floating gate and a control gate, the selection transistor being further connected to a source line of the flash EEPROM memory, which source line is common for a plurality of memory cells, and the memory transistor being further connected to a bit line of the flash EEPROM memory.

6. The semiconductor device of claim 1, wherein said p-type wells are isolated by buried n-type wells.

7. The semiconductor device of claim 1, wherein the memory cells are programmed by Fowler Nordheim tunnelling through the channel of the memory cell by:

applying a positive voltage to a control gate line of a selected row, applying a negative voltage to the p-type well of a selected column and ground to the p-type well of unselected columns, applying a negative voltage for writing a bit 0 or ground for writing bit 1 to bit lines in a selected column, leaving the source lines floating, grounding the gate of switching elements of the selected column and applying a positive voltage to the gate of switching elements of unselected columns, and applying a positive voltage to the n-type well.

8. The semiconductor device of claim 1, wherein the memory cells read by:

applying a positive voltage to a control gate line of a selected row, grounding the p-type wells, applying a positive voltage to bit lines in a selected column, grounding the source lines, grounding the gate of switching elements of a selected column and applying a positive voltage to the gate of a switching elements of unselected columns, applying a positive voltage to the n-type well.

9. The semiconductor device of claim 1, wherein the memory cells are erased by Fowler Nordheim tunnelling through the channel of the memory cell by:

applying a negative voltage to a control gate line of a selected row and a positive voltage to control gate lines of unselected rows, applying positive voltages to the p-type wells, the positive voltage applied to the p-type well of a selected column being larger than the positive voltage applied to the p-type well of unselected columns, leaving the bit lines floating, leaving the source lines floating, applying a negative voltage to the gate of switching elements of the selected column and applying a positive voltage to the gate of switching elements of unselected columns, and applying a positive voltage to the n-type well.

* * * * *